US012571127B2

(12) United States Patent
Wu et al.

(10) Patent No.: US 12,571,127 B2
(45) Date of Patent: Mar. 10, 2026

(54) ULTRA-HIGH THERMAL-CONDUCTIVITY DIAMOND AND SYNTHETIC METHOD THEREFOR

(71) Applicants: Zhengzhou Research Institute For Abrasives & Grinding Co., Ltd., Henan (CN); Sinomach Diamond (Henan) Co., Ltd., Henan (CN)

(72) Inventors: Xiaolei Wu, Henan (CN); Shuai Xu, Henan (CN); Yanjun Zhao, Henan (CN); Wentao Zhou, Henan (CN); Bolun Cao, Henan (CN); Ning Yan, Henan (CN); Shihao Kang, Henan (CN); Junyong Shao, Sichuan (CN); Guannan Sun, Henan (CN)

(73) Assignees: Zhengzhou Research Institute For Abrasives & Grinding Co., Ltd., Zhengzhou (CN); Sinomach Diamond (Henan) Co., Ltd, Zhengzhou (CN)

( * ) Notice: Subject to any disclaimer, the term of this patent is extended or adjusted under 35 U.S.C. 154(b) by 0 days.

(21) Appl. No.: 18/948,586

(22) Filed: Nov. 15, 2024

(65) Prior Publication Data

US 2025/0171926 A1 May 29, 2025

(30) Foreign Application Priority Data

Nov. 23, 2023 (CN) .......................... 202311571043.0

(51) Int. Cl.
B32B 3/02 (2006.01)
C30B 25/10 (2006.01)
C30B 25/18 (2006.01)
C30B 29/04 (2006.01)
C30B 33/00 (2006.01)

(52) U.S. Cl.
CPC ................ *C30B 29/04* (2013.01); *B32B 3/02* (2013.01); *C30B 25/105* (2013.01); *C30B 25/186* (2013.01); *C30B 33/00* (2013.01)

(58) Field of Classification Search
CPC ........ C30B 25/02; C30B 29/04; C32C 16/274
See application file for complete search history.

(56) References Cited

U.S. PATENT DOCUMENTS

2014/0342122 A1* 11/2014 Inglis ................ C23C 16/45563
                                                        428/141
2019/0003043 A1* 1/2019 Wickham .............. C23C 16/274

* cited by examiner

*Primary Examiner* — Elizabeth E Mulvaney
(74) *Attorney, Agent, or Firm* — SOLID STATE LAW

(57) ABSTRACT

An ultra-high thermal-conductivity diamond is provided. The ultra-high thermal-conductivity diamond is polycrystalline diamond with a highly oriented crystals along <110> or <100> direction. It has a diameter of ≥100 mm in linear dimension and a thickness of ≥300 m, a thermal conductivity of ≥1800 W/(m·K) at 298K, and at least one surface with Ra≤10 nm, and further includes one or more of the following features: a content of nitrogen impurity ≤100 ppb, a dielectric constant ≥5.4 a dielectric loss tangent tanδ≤6×10$^{-5}$, a volume resistivity ≥1×10$^{11}$ Ωm, and a breakdown voltage ≥1000 V. The method for synthesizing the ultra-high thermal-conductivity diamond includes: providing a substrate for the diamond growth and a microwave plasma reactor, and performing the epitaxial growth of the ultra-high thermal-conductivity diamond on the substrate surface by using the reactor.

12 Claims, 2 Drawing Sheets

1

ULTRA-HIGH THERMAL-CONDUCTIVITY DIAMOND AND SYNTHETIC METHOD THEREFOR

CROSS-REFERENCE TO RELATED APPLICATION

The present disclosure claims the priority to the Chinese patent application with the filling No. 2023115710430 filed with the Chinese Patent Office on Nov. 23, 2023, and entitled "ULTRA-HIGH THERMAL-CONDUCTIVITY DIA-MOND AND SYNTHETIC METHOD THEREFOR", the contents of which are incorporated herein by reference in entirety.

TECHNICAL FIELD

The present disclosure belongs to the field of material science and technology, and specifically relates to an ultra-high thermal-conductivity diamond and a synthetic method therefor.

BACKGROUND ART

As a third-generation semiconductor material, gallium nitride has advantages such as a wide band gap, a high electrical breakdown field, and a high carrier mobility. Compared to silicon-based semiconductor components, the gallium nitride can operate at higher voltages and frequencies, and at the same time consumes less electric power, has a larger output power density, and is more durable and more reliable. With its excellent performance, the gallium nitride semiconductor components can meet the requirements for high-power, high-voltage, high-frequency components in modern society. Therefore, the gallium nitride has become a first choice for a new-generation semiconductor material that is faster, miniaturized, lightweight, low-cost, and high-efficient. However, with the continuous improvement and advancement of design and manufacturing processes of the gallium nitride semiconductor component, its output power and frequency are increasingly higher, and the component size is gradually smaller. When the component size is miniaturized and the output power of the component is increased, the thermal accumulation effect in the active area of the component increases rapidly at the same time. How-ever, the heat dissipation ability of the traditional substrate material with a low thermal conductivity is limited, which prevents the heat of the component from further diffusing to the surrounding environment. The component has a more and more prominent problem of overheating and its reliabil-ity and stability are seriously challenged, which gradually becomes one of the main obstacles restricting the gallium nitride semiconductor components from developing towards a direction with higher performance and higher degree of integration. The problem of high-efficient heat dissipation of the gallium nitride semiconductor components has become a problem that cannot be ignored in its development.

Currently, the thermal management technologies, such as heat pipe technology, temperature equalizing technology by vapor chamber, heat-transfer technology by forced convec-tion, and heat conduction filler with low thermal resistance, are commonly used for modern microelectronics, and they all put forward requirements for the thermal conductivity of the material. The traditional high thermal-conductivity materials are usually metal, alloy, or non-metal/metal com-posite materials. The copper, aluminum, tungsten copper, molybdenum copper, and other metal or alloy materials are limited by their own thermal conductivity, thermal expan-sion coefficient, weight, and other limitations, so that they are difficult to meet the material requirements of the above thermal management technology. The diamond/copper, sili-con carbide/aluminum, and other composite materials have better thermal properties, wherein the thermal conductivity can reach 400 W/(m·K) to 600 W/(m·K). However, the composite material has serious problems of interface bond-ing and interface thermal resistance, wherein the thermal cycling during use is easy to lead to degradation of the interface and decline of the thermal conductivity perfor-mance of the composite material.

The thermal conduct in a diamond is mainly realized by vibrations (phonon heat conduction) of the crystal lattice or crystal point array. The carbon atoms of the diamond are bonded with sp3 bonds, which are covalent bond structures with strong polarity, and the Debye temperature thereof is high. The covalent bond between the carbon atoms has a high vibration frequency, and anharmonic effect in the crystal lattice dynamics is weak, so that the phonon scatter-ing is smaller and the resistance of heat conduction mediated by the phonon is very small, so that the thermal conductivity of the diamond is up to 2200 W/(m·K) at room temperature. The phonon heat transfer mechanism in the diamond pro-vides it with the highest thermal conductivity in any known solid material, wherein the thermal conductivity under room temperature of the diamond is approximately five times or more than that of currently used high thermal-conductivity materials, such as copper et. al. It has been proven by extensive research that the diamond is the best thermal management material consisted of the gallium nitride semi-conductor components. The ultra-high thermal-conductivity diamond substrate can improve the performance of the gallium nitride component by several times, and effectively reduce the size of the component, so as to compact the electronic system.

In the semiconductor industry, the large-size wafer is a prerequisite to realize the mass and high efficient production of the semiconductor, and the size of the wafer used to produce the gallium nitride component usually reaches 4 inches or more. When the diamond is boned to the gallium nitride wafer as a high thermal-conductivity material, the diamond is required to have a size matched to the gallium nitride wafer, an ultra-high thermal conductivity, and an ultra-flat surface. However, a known problem in the art is that the ultra-high thermal conductivity and large-area homogeneity of the diamond are difficult to achieve.

The advantages in terms of growth quality, growth effi-ciency, growth area, and energy efficiency of the diamond obtained by adapting the microwave plasma chemical vapor deposition technology are known in the art. Ideally, a large area of high-density plasma produced by the microwave plasma reactor is uniformly formed above the substrate, so that carbon-hydrogen radicals can diffuse from the plasma to the substrate, and the subsequent growth of diamond on the substrate surface, so that the large-area homogeneity of the synthesized diamond can be controlled. However, the reality is that the plasma is distributed coaxially with the reactor, and the plasma density rapidly decreases from the axis center towards the chamber wall of the reactor. This distri-bution leads to that the plasma density is very high at the center region above the substrate but decreases significantly towards the edge of the substrate, which ultimately results in a huge difference in the growth between the center and edge regions of the diamond on the substrate surface.

Another problem for synthesizing the diamonds is that impurities such as nitrogen and silicon are very easily unfavorable combined into the diamond during the growth of the diamond, which results in a decrease of the thermal performance of the diamond. The nitrogen impurity usually derives from imperfect sealing of the vacuum chamber of the microwave plasma reactor, and the nitrogen in the atmosphere permeates into the reactor and combines with the diamond. Additionally, impurities in the atmosphere adsorbed onto the wall of the vacuum chamber of the reactor will also enter into the growth environment of the diamond as residual impurities. The silicon impurities usually derive from the etching of silicon containing components in the reactor by hydrogen in the plasma, for example, the silicon in quartz windows exposed to the high temperature decomposes and enters into the diamond.

Despite the above problems, the polycrystalline diamond wafer that can be commercialized so far usually has a size of 2-3 inches (with a diameter of approximately 50-75 mm), and a thermal conductivity of 1200-1600 W/(m·K). The production of the polycrystalline diamond wafer with the ultra-high thermal conductivity with the size of 4 inches (with a diameter of approximately 100 mm) and the thermal conductivity more than 1800 W/(m·K) is usually proved to be problematic and defective. Although the diamond wafers with the large size can be provided, these diamond wafers have a lower thermal performance, especially the quality is gradually worse from the center to the edge of the wafer, so that these wafers cannot meet the requirements of commercial applications. Based on the above issues, the present disclosure is provided.

SUMMARY

In order to overcome the deficiencies in the prior art, the present disclosure provides a diamond material with an ultra-high thermal conductivity (e.g., with a thermal conductivity more than 1800 W/(m·K)) and a large area (e.g., with a diameter more than 100 mm), and all regions of the diamond have the basically consistent thermal performance.

The present disclosure further provides a synthetic method of the above diamond material with the ultra-high thermal conductivity and the large area.

In order to realize the above purposes, the present disclosure adopts the following technical solutions.

According to the first object of the present disclosure, the present disclosure provides a diamond wafer material with the ultra-high thermal conductivity and the large area, including the following features:

(1) a diameter ≥100 mm in linear dimension and a thickness ≥300 μm;

(2) a thermal conductivity of ≥1800 W/(m·K) at 298K; and (3) at least one surface with a surface roughness Ra≤10 nm.

The above ultra-high thermal-conductivity diamond further includes that the ultra-high thermal-conductivity diamond is a polycrystalline diamond with a highly oriented crystal structure and crystallizing in a <110> or <100> direction.

Specifically, the above ultra-high thermal-conductivity diamond further includes that the ultra-high thermal-conductivity diamond has two characteristic primary surfaces including one nucleation side and one growth side, wherein a nucleation density of the nucleation side is ≥1×10⁹/cm², and a grain size of the growth side is 50 μm-200 μm. The ultra-high thermal-conductivity diamond further includes that the ultra-high thermal-conductivity diamond contains nitrogen impurity of ≤100 ppb, and the ultra-high thermal-conductivity diamond has a black spot defect size of ≤100 μm, wherein an average black spot density is ≤1/cm².

Further, the above ultra-high thermal-conductivity diamond further includes that the ultra-high thermal-conductivity diamond has a dielectric constant of ≥5.4, a dielectric loss tangent tanδ of ≤6×10⁻⁵, a volume resistivity of ≥1×10¹¹ Ωm, and a breakdown voltage of ≥1000V@300 μm.

As a preferred embodiment of the present disclosure, the present disclosure provides an ultra-high thermal-conductivity diamond with the following features.

(1) The ultra-high thermal-conductivity diamond includes but is not limited to one or more of the following size specifications: such as a diameter of 100 mm in linear dimension and a thickness of 300 μm; a diameter of 125 mm in linear dimension and a thickness of 500 m; and a diameter of 150 mm in linear dimension and a thickness of 700 μm.

(2) The ultra-high thermal-conductivity diamond has a thermal conductivity of ≥1800 W/(m·K) at 298K, which means a method of taking a standard test sample with a diameter of 20 mm every 20 mm along any radius direction of the ultra-high thermal-conductivity diamond wafer, and testing a thermal diffusion coefficient of the standard test sample by a laser flash method using conductometer, for example, as for the wafer with the diameter of 100 mm, taking 0 mm, 20 mm, and 40 mm from the center point for testing respectively; as for the wafer with the diameter of 125 mm, taking 0 mm, 20 mm, and 40 mm from the center point for testing respectively; and as for the wafer with the diameter of 150 mm, taking 0 mm, 20 mm, 40 mm, and 60 mm from the center point for testing respectively.

The thermal conductivity is calculated by using the following formula:

$$\lambda(T) = a_r(T) \cdot c_p(T) \cdot \rho(T),$$

λ=the thermal conductivity [W/(m·K)];
$a_r$=a thermal diffusion coefficient [mm²/s] at a distance r from the center point, and taking the measured value;
$c_p$=specific heat [J/(g·K)], and tanking a value of 0.52 J/(g·K);
ρ=density [g/cm³], and taking a value of 3.52 g/cm³; and T represents the test temperature and is set to be 298K.

(3) The ultra-high thermal-conductivity diamond has a surface with a surface roughness Ra≤10 nm, wherein the surface refers to the surface of the ultra-high thermal-conductivity diamond after departing from the substrate; and more preferably, the surface roughness Ra is ≤5 nm, the surface roughness Ra is ≤2 nm, or the surface roughness Ra is ≤1 nm.

(4) The ultra-high thermal-conductivity diamond is a polycrystalline diamond with a highly oriented crystal structure and crystallizing in the <110> or <100> direction.

(5) The ultra-high thermal-conductivity diamond has the characteristic primary surface including a nucleation side, wherein a nucleation density of the nucleation side is ≥1×10⁹/cm²; and more preferably, the nucleation density is ≥5×10⁹/cm², or the nucleation density is ≥1×10¹⁰/cm².

(6) The ultra-high thermal-conductivity diamond has the characteristic primary surface including a growth side, wherein a grain size of the growth side is 50 μm-200 m; and more preferably, the grain size is 100 μm-150 μm.

(7) The ultra-high thermal-conductivity diamond contains the nitrogen impurity of ≤100 ppb; and more preferably, contains the nitrogen impurity of ≤50 ppb, or contains the nitrogen impurity of ≤10 ppb.

(8) The ultra-high thermal-conductivity diamond has a black spot defect size of ≤100 m; and more preferably, the black spot defect size is ≤50 μm, or the black spot defect size is ≤10 μm. The average black spot density is ≤1/cm²; and more preferably, the average black spot density is ≤0.5/cm², or an average black spot density is ≤0.1/cm².

(9) The ultra-high thermal-conductivity diamond has a dielectric constant of ≥5.4, and a dielectric loss tangent tanδ of ≤6×10⁻⁵.

(10) The ultra-high thermal-conductivity diamond has a volume resistivity of ≥1×10¹¹ Ωm, and a breakdown voltage of ≥1000V@300 μm.

The ultra-high thermal-conductivity diamond described by the present disclosure can include any combinations of the foregoing 10 features, preferably including at least 2 of them, and most preferably including a combination of all 10 features.

According to the second object of the present disclosure, the present disclosure further provides a synthetic method for the above ultra-high thermal-conductivity diamond, including the following steps:

(1) providing a substrate for the diamond growth, and then forming a structural modulation layer of the diamond or nucleation sites of the diamond on a substrate surface;

(2) providing a microwave plasma reactor for the diamond growth to uniformly form a plasma containing carbon-hydrogen radicals above the substrate;

(3) performing a chemical vapor deposition on the substrate surface for an epitaxial growth of the diamond; and (4) stripping the diamond from the substrate, and grinding and polishing the nucleation side and the growth side of the diamond.

The synthetic method described above, specifically, the substrate can include one of a single crystal silicon substrate or a refractory metal (refractory metals include titanium, molybdenum, niobium, tantalum, and tungsten) substrate forming the carbide, and the substrate has at least one finished surface with a roughness of ≤10 nm and a change in flatness of ≤10 μm.

Further, forming the structural modulation layer of the diamond on the substrate surface is to take the single crystal silicon (100) facet as the finished surface and form the single crystal silicon carbide on the finished surface, wherein forming the nucleation sites of the diamond on the substrate surface is to form a point or linear surface damage with a width and depth of ≤100 nm and a maximum spacing of ≤55 μm on the finished surface of any substrate.

Specifically, the microwave plasma reactor can form a plasma with an effective diameter of ≥100 mm above the substrate, wherein an average concentration of atomic hydrogen (Hα+Hβ) of the plasma in an effective diameter range is ≥1×10¹⁷/m³, and a distribution difference of the atomic hydrogen concentration is ≤10%.

Further, the epitaxial growth of diamond described in step (3) includes one or more of the following steps:

(1) cleaning the substrate surface in a hydrogen plasma at a temperature of 700-900° C.;

(2) carrying out the nucleation of the diamond in carbon-hydrogen plasma containing 2-6% carbon at a temperature of 750-850° C.;

(3) stabilizing an oriented growth of a crystal nucleus of the diamond in carbon-hydrogen plasma containing 1-4% carbon at a temperature of 680-780° C.; and (4) carrying out the epitaxial growth of diamond in carbon-hydrogen plasma containing 0.5-3% carbon at a temperature of 850-1050° C.

As a preferred embodiment of the present disclosure, the present disclosure further provides a preferred synthetic method for the above ultra-high thermal-conductivity diamond, which is realized by the following technical solution:

providing the substrate for the diamond growth, and forming the structural modulation layer of the diamond or the nucleation sites of the diamond on the substrate surface.

The polycrystalline diamond is grown on the special substrate through the chemical vapor deposition by utilizing the microwave plasma reactor. The principle of selecting these substrates is explained as follows. The substrates that may be suitable for the growth of the diamond are divided into three major categories according to the diffusion coefficients and the reaction forms of carbon on the non-diamond substrate surface, i.e., materials in which the carbon has small solubility or which is non-reactive with the carbon, such as gold, silver, and copper; substrates in which the carbon is easy to diffuse or dissolve to form the carbide, such as iron, cobalt, nickel, platinum, palladium, rhodium, and iridium; and substrates in which the carbon strongly diffuses or forms the carbide with strong covalent bonds, such as titanium, zirconium, molybdenum, niobium, tantalum, tungsten, and silicon.

It is generally accepted in the art that the nucleation of diamond on the non-diamond substrate usually occurs through an intermediate transition layer, and the transition layer is generated by the interaction of carbon with the substrate. The carbon diffuses into the substrate during the deposition process and precipitates out when reaching its saturated concentration, which acts as preferred nucleation sites of the diamond for the nucleation and growth of the diamond. It has been found so far that the diamond can be deposited on the surface of a plurality of substrate materials, such as transition metals, various variants of carbon, silicon and carbides, nitrides, and oxides of silicon. Considering the easy accessibility and economy of the large-area substrates by inventors, the specified selected substrate includes one of a single crystal silicon substrate or refractory metal substrates (such as titanium, molybdenum, niobium, tantalum, and tungsten) forming the carbide, and the any substrate has at least one finished surface with the roughness of ≤10 nm and the flatness change of ≤10 μm.

The structural modulation layer of the diamond formed on the substrate surface is a single crystal silicon carbide layer with a thickness of 10-50 μm formed on the finished surface of the (100) single crystal silicon substrate by the chemical vapor deposition. The formation of the structural modulation layer can reduce the lattice mismatch between the single crystal silicon and the diamond, so that the diamond epitaxial layer forms a continuous highly oriented structure along the <100> crystallization direction.

Forming the diamond nucleation sites on the substrate surface is to grind the diamond powder on the finished surface of any substrate, and to form the point or linear surface damage with the width and depth of ≤100 nm and the maximum spacing of ≤5 μm, so as to form the diamond nucleation sites with high density on the substrate surface, so that the diamond epitaxial layer forms a dense and highly oriented columnar crystal structure along the <110> crystallization direction.

The microwave plasma reactor for the diamond growth is provided, wherein the reactor can uniformly form the large-area and high-density plasma containing the carbon-hydrogen group above the substrate. It is known in the art that the atomic hydrogen with a high concentration in the plasma plays an important role in the diamond growth, and the ideal situation is to form the atomic hydrogen with the high concentration in the effective range of the plasma. Compared to the excitation energy of free radicals such as $C_2$, which is 0.09-2.41 eV, the excitation energy of the atomic hydrogen is up to 12.09 eV, and it can only significantly discompose the molecular hydrogen into the atomic hydrogens by heating up to 2000 k. The existing microwave plasma reactor usually has a high plasma density at the center position of the plasma, but the decay gradient of the plasma density outside the center of the plasma is quite large (the dotted line shown in FIG. 1). The atomic hydrogen with the high concentration usually exists only at the center position of the plasma, and the carbon-containing free radicals spread throughout the plasma, so as to result in an uneven chemical composition in a diameter range of the plasma, and the uneven decomposition and fragmentation of the ultimate diamond. This uneven phenomenon is particularly obvious on larger plasma diameters, so that the size of the diamonds is limited.

Considering the above effects, the inventors of the present disclosure found in the design of the microwave plasma reactor that the distribution of the plasma can be changed by constructing different reactor structures, and the plasma (the solid line in FIG. 1) with a nearly uniform distribution can be formed within a range of a diameter of ≥100 mm above the substrate by reasonable constructing the reactor; and the distribution characteristic of the plasma can be proved from the concentration distribution of the atomic hydrogens (mainly Hα and Hβ) in the plasma emission spectra, wherein the concentration of the atomic hydrogens with such a plasma distribution characteristic is usually ≥1×$10^{17}$/m³, and the difference of the concentration distribution of the atomic hydrogens crossing the substrate surface is usually controlled to be ≤10%.

The process of the epitaxial growth of the ultra-high thermal-conductivity diamond on the substrate surface through the chemical vapor deposition by using the microwave plasma reactor includes one or more of the following processes:

(1) cleaning the substrate surface in the hydrogen plasma at a temperature of 800° C. for 5-30 min;

(2) carrying out the nucleation of the diamond in carbon-hydrogen plasma containing 2-6% carbon at a temperature of 750-850° C. for 10-60 min;

(3) stabilizing the oriented growth of the crystal nucleus of the diamond in carbon-hydrogen plasma containing 1-4% carbon at a temperature of 680-780° C. for 30-120 min; and (4) carrying out the epitaxial growth of diamond in carbon-hydrogen plasma containing 0.5-3% carbon at a temperature of 850-1050° C., and stopping the epitaxial growth according to the thickness requirement.

In the above process (1), the excitation gas of the hydrogen plasma is hydrogen.

In the above processes (2), (3), and (4), the excitation gas of the carbon-hydrogen plasma is a mixture of hydrogen and methane.

In the above processes (2), (3), and (4), optionally, nitrogen at a controlled flow rate is introduced simultaneously at a concentration smaller than 100 ppb.

In the above processes (2), (3), and (4), optionally, argon at a controlled flow rate is introduced simultaneously at a concentration of 5-20%.

In the above processes (2), (3), and (4), optionally, oxygen at a controlled flow rate is introduced simultaneously at a concentration of 0.5-2%.

In the above processes (2), (3), and (4), the percentage content of the carbon is calculated by a mass flow rate of methane relative to hydrogen; the content of the nitrogen is calculated by a mass flow rate of the nitrogen relative to the hydrogen; the content of the argon is calculated by a mass flow rate of the argon relative to the hydrogen; and the content of the oxygen is calculated by a mass flow rate of the oxygen relative to the hydrogen.

During the epitaxial growth process of the diamond, the phonon scattering during the heat transfer process plays a prominent effect on the thermal conductivity of the diamond. Considering the structural and compositional characteristics of the polycrystalline diamond, the phonon scattering in the polycrystalline diamond includes the following ways.

(1) The lattice defect scattering formed from the interaction between the phonon and the impurity defect in the diamond. The most main and common impurity in the diamond is nitrogen. Since the difference between the atomic radii of the nitrogen atom and the carbon atom is small, the nitrogen atoms can occupy a large number of the lattice sites of the diamond in many forms, such as a single displacement nitrogen atom Ns (C center) in a neutral or charged state, two adjacent displacement nitrogen atoms (A aggregate), groups of several nitrogen atoms (B aggregate), or being a center of complexes NV, NVN, NVH formed by the nitrogen atom and a vacancy. These defects are very strong phonon scatterers, and form a severe limitation to the heat transfer process of the diamond. In the diamond synthesized by the chemical vapor deposition, the nitrogen atom mainly exists in the form of the C center. The thermal conductivity at the room temperature usually decreases significantly in the diamond with a high nitrogen content (≥10 ppm) relative to the high purity diamond with a low nitrogen content (≤100 ppb).

Considering the above effects, the inventors of the present disclosure found that during the synthesis process of the diamond, through preventing the gases (hydrogen and methane) from the raw material, gas impurities absorbed on the vacuum chamber wall of the reactor, and the air from permeating into the vacuum chamber, the nitrogen impurity content in the diamond can be effectively reduced to less than 100 ppb, and more preferably less than 50 ppb, or less than 10 ppb.

(2) The scattering formed by the interaction of the phonon and structural defects in the diamond. The structural defects in the intact diamond single crystal mainly include one-dimensional structural defect (dislocation) and two-dimensional structural defect (twinning and stacking fault), which belong to microstructural defects. Different from the single crystal, the polycrystalline diamond mainly includes macroscopic three-dimensional structural defects (void and black spot), which adversely affect the actual heat transfer process of the diamond. The void mainly occurs on the nucleation side close to the polycrystalline diamond, which includes the nucleus spacing after the nucleation due to a lower diamond nucleation density, and the void caused by the competitive growth of diamond grains. The black spot mainly occurs close to the growth side of the polycrystalline diamond, which includes the aggregation of carbonaceous black spots caused by the non-oriented growth of the diamond grains and the incomplete etching of non-diamond carbon by the hydrogen ions.

Considering the above effects by the inventors, the nucleation density of the nucleation side during the diamond synthesis process is controlled to be $\geq 1 \times 10^9/cm^2$, and the crystal orientation of the highly oriented crystal is formed in the <110> or <100> direction, so that a size of the black spot defect is $\leq 100$ μm, and the average black spot density is $\leq 1/cm^2$, so as to reduce the adverse effects of the void and the black spot defects on the diamond thermal conductivity.

(3) The boundary scattering of phonons at the grain boundary of the polycrystalline diamond. The actual heat transfer process of the polycrystalline diamond is related to the quantity of the grain boundaries and the quality of the grain boundaries. The nature of the hindering effect of the grain boundaries to the phonon transferring heat lies in the disordered arrangement of atoms and non-sp3 bonding of the atoms at the grain boundaries, wherein the finer the grains are, the more grain boundaries are, and the larger the non-sp3 bonding ratio is, the larger the hindering effect to the phonon transferring heat is.

Considering the above effects by the inventors, during the diamond synthesis process, the grain size is controlled to be 50 μm-200 μm, and the crystal quality of the diamond at the grain boundary is controlled, so as to obtain the ultra-high thermal-conductivity diamond with a thermal conductivity of $\geq 1800$ W/(m K).

After the diamond epitaxially grows to a specified thickness, the growth is stopped and the substrate is stripped from the ultra-high thermal-conductivity diamond layer, and finally the nucleation side and the growth side of the ultra-high thermal-conductivity diamond are ground and polished.

Compared with the prior art, the method of the present disclosure includes the following beneficial effects.

The ultra-high thermal-conductivity diamond with the characteristics described by the present disclosure can be obtained by the design of the microwave plasma reactor and the synthesis process of the diamond. Through the technical solutions of the present disclosure, the ultra-high thermal-conductivity diamond with the diameter of $\geq 100$ mm and the thermal conductivity of $\geq 1800$ W/(m·K) can be synthesized, and all regions of the diamond have the basically consistent thermal performance, which overcomes the technical defect of the lower thermal performance of the existing diamonds of this type, and effectively avoids the occurrence of the phenomenon that the quality of the existing diamond wafer is easy to be worse gradually from the center of the wafer to the edge, so as to satisfy the application requirement of efficient heat dissipation for the gallium nitride semiconductor components.

BRIEF DESCRIPTION OF DRAWINGS

In order to better understand the technical features of the present disclosure and how to realize the technical solutions of the present disclosure, the following will be used to better describe the summary of the present disclosure referring to drawings and in conjunction with embodiments.

DETAILED DESCRIPTION OF EMBODIMENTS

The technical solutions of the present disclosure are further described in detail below in connection with embodiments, but the scope of protection of the present disclosure is not limited thereto.

In the following embodiments, the raw materials used are common commercially available products that can be purchased directly or can be prepared by conventional methods in the field.

In the present disclosure, the selected substrate can be the finished substrate product by direct purchase, or can be processed by the conventional technical methods in the field, so as to obtain the substrate product with the corresponding roughness and flatness change. The processes not mentioned in detail, such as stripping, grinding, and polishing, etc., are the conventional technologies in the field, and thereby it is not the invention of the present disclosure, so that it will not repeat.

Example 1

A synthetic method of an ultra-high thermal-conductivity diamond specifically included the following steps.

A metal tungsten substrate with a diameter of 150 mm was selected, wherein the metal tungsten substrate had a polished surface with Ra of 2 nm and a flatness change of 10 μm. The polished surface of the metal tungsten substrate was ground by using the diamond powder with a particle size of 2 μm, so as to form a surface damage with a width and a depth of 100 nm and a maximum spacing of 5 μm on the substrate surface of the metal tungsten.

The metal tungsten substrate was placed into the microwave plasma reactor, and 1000 sccm of the hydrogen gas was passed into the reactor. The concentration distribution of Ha and Hβ in the plasma of the reactor was measured by using the plasma emission spectrum, and the microwave input power of the reactor was adjusted to be 50 kW and the gas pressure was adjusted to be 130 Torr, so as to uniformly form a high-density plasma with a diameter more than 150 mm in the reactor, and obtain the atomic hydrogen (Hα+Hβ) with an average concentration of $1.0 \times 10^{17}/m^3$, wherein a distribution difference of the atomic hydrogen concentration was 10%.

The power and gas pressure of the reactor were maintained; the flow rates of hydrogen/methane were adjusted to be 3000/50 sccm respectively; and the nitrogen at a controlled flow rate was introduced simultaneously at a concentration of 80 ppb; the surface temperature of the substrate was adjusted to be 950° C.; and the temperature difference from the center to the edge of the substrate was controlled within 40° C. The epitaxial growth of the diamond was carried out by chemical vapor deposition under this condition.

Figure 1:
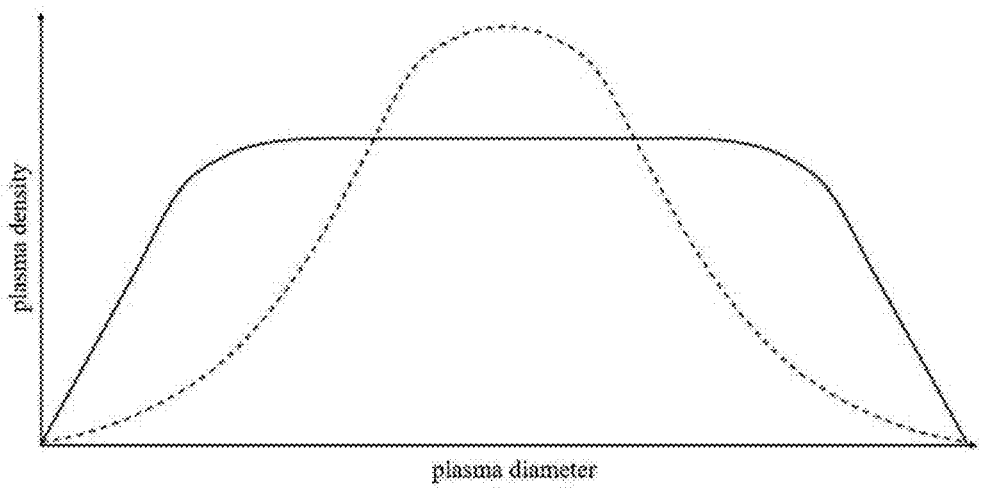
FIG. 1 shows a plasma density distribution characteristic.
Figure 2:
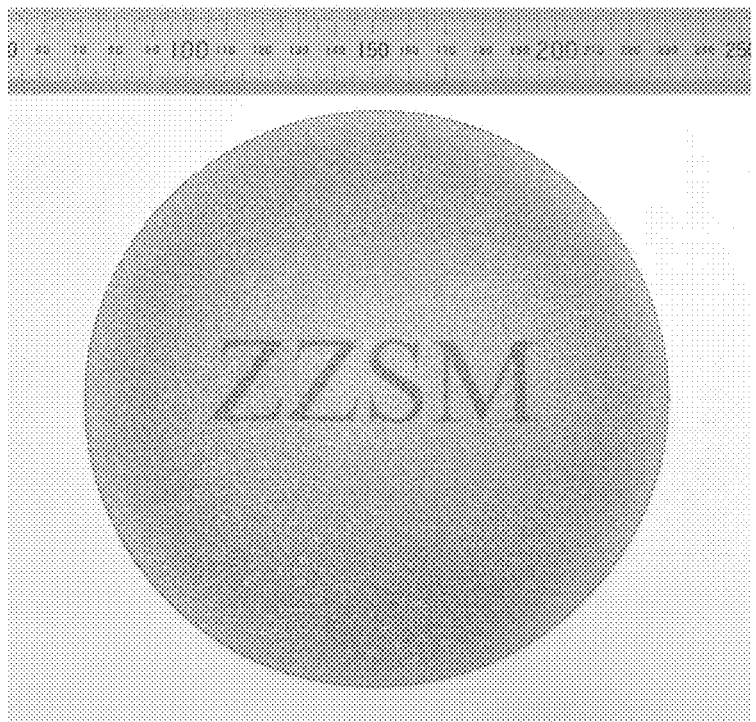
FIG. 2 shows an ultra-high thermal-conductivity diamond wafer with a diameter of 150 mm in Example 1, wherein it can be seen from the figure that a crystal quality of a wafer from the center to the edge is consistent.
Figure 3:
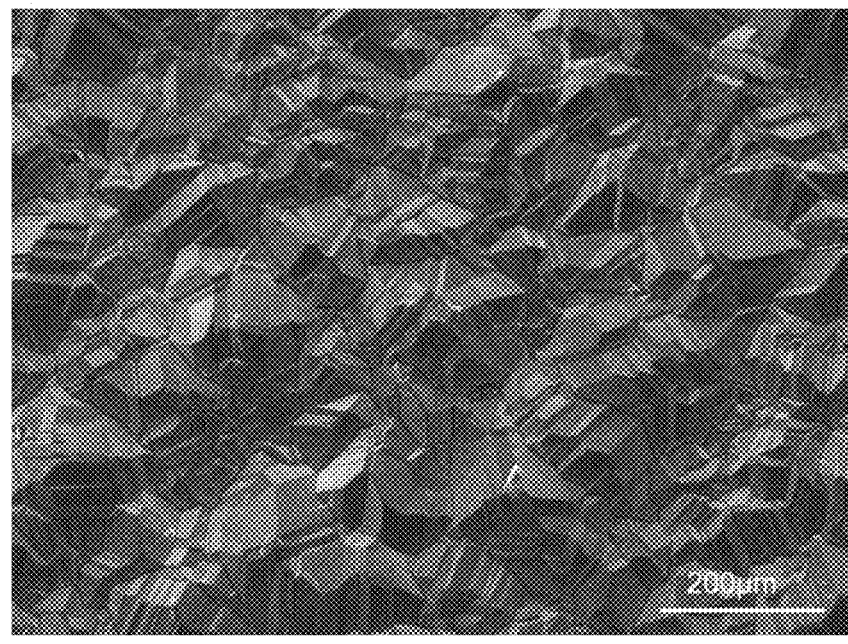
FIG. 3 shows highly oriented crystallization of a diamond formed in a <110> direction, wherein it can be seen from the figure that a diamond has a <110> crystallization characteristic.

The synthesis process was stopped after the diamond crystal had grown to a thickness more than 950 μm, and the substrate was stripped off, so as to obtain the diamond wafer with a diameter of 150 mm (shown in FIG. 2). The diamond was detected by the SEM to have a characteristic surface crystallizing along the <110> direction, and the grain sizes were in the range of 50 μm-200 μm (shown in FIG. 3).

The nucleation side and the growth side of the diamond were ground and polished, so as to obtain the diamond wafer with an average thickness of 700 μm and a surface roughness Ra of 8 nm.

One piece of standard test sample with a diameter of 20 mm was cut respectively at positions of 0 mm, 20 mm, 40 mm, and 60 mm away from the center point of the diamond wafer, and they were used to test the thermal diffusion coefficient at 298 k by the laser flash method using conductometer. The thermal conductivity was calculated according to the thermal diffusion coefficient of each standard test sample obtained by the test in the table, and the result is shown in the table below. The result in the table shows that the thermal conductivities of the diamond wafer from the center to the edge are essentially consistent, and they all satisfy the range of ≥1800 W/(m·K) defined by the present disclosure.

| Distances from center point (mm) | 0 | 20 | 40 | 60 |
|---|---|---|---|---|
| $a_r$ (mm$^2$/s) | 1033 | 1021 | 1010 | 1017 |
| λ (W/(m · K)) | 1891 | 1869 | 1849 | 1862 |

Example 2

A synthetic method of the ultra-high thermal-conductivity diamond specifically included the following steps.

The single crystal silicon substrate with a diameter of 100 mm and a finished surface with a roughness Ra of 2 nm and a flatness change of 7 μm was selected. The polished surface of the single crystal silicon substrate was ground by using the diamond powder with a particle size of 0.5 μm, so as to form a surface damage with a width and a depth of 60 nm and a maximum spacing of 3 μm on the substrate surface of the single crystal silicon.

The single crystal silicon substrate was placed into the microwave plasma reactor, and the 1000 sccm of the hydrogen gas was passed into the reactor. The concentration distribution of the plasma in the reactor was measured by using the plasma emission spectrum, and the microwave input power of the reactor was adjusted to be 30 kW and the gas pressure was adjusted to be 160 Torr, so as to form the plasma with a diameter more than 100 mm in the reactor, and the average concentration of Hα+HR was measured to be 1.2×10/m$^3$ within a range of 100 mm in diameter, wherein a distribution difference of the atomic hydrogen concentration was 8%.

The power and gas pressure of the reactor were maintained; the flow rate of hydrogen was adjusted to be 1500 sccm; and the surface temperature of the substrate was adjusted to be 800° C. This step was carried out for 5 min followed by cleaning the substrate surface.

The flow rates of hydrogen/methane were adjusted to be 3000/60 sccm respectively; the surface temperature of the substrate was adjusted to be 850° C.; and the temperature difference from the center to the edge of the substrate was controlled within 30° C. This step was carried out for 15 min to form a diamond nucleation density of 1×10$^{10}$/cm$^2$ on the substrate surface.

The flow rate of hydrogen was maintained; the flow rates of methane/argon/oxygen were adjusted to be 40/200/15 sccm respectively; and the surface temperature of the substrate was adjusted to be 900° C. The synthesis process was stopped after the diamond crystal had grown to a thickness more than 450 μm, and the substrate was stripped off to obtain the diamond wafer with a diameter of 100 mm. The diamond was detected by the SEM to have a characteristic surface crystallizing along the <110> direction, and the grain sizes were in the range of 50 μm-200 μm.

The nucleation side and the growth side of the diamond were ground and polished, and the thickness of 30 μm of the nucleation side was removed, so as to obtain the diamond wafer with an average thickness of 300 μm and a surface roughness Ra of ≤5 nm.

The detection result under the optical microscope was that the size of the black spot defect of the diamond was lower than 50 μm, and the density of the black spots over 10 μm was 0.1/cm$^2$. The diamond was detected by ESR to contain nitrogen impurity of 22 ppb.

The dielectric constant of the diamond was detected to be 5.5 by the resonance method at 140 GHz, and the dielectric loss tangent tanδ was 5.9×10$^{-5}$.

The volume resistivity of the diamond was detected to be 1.2×10$^{11}$ Ωm by a high resistance tester, and the breakdown voltage was 1550V.

One piece of standard test sample with a diameter of 20 mm was cut respectively at positions of 0 mm, 20 mm, and 40 mm away from the center point of the diamond wafer, and they were used to test the thermal diffusion coefficient at 298 k by the laser flash method using conductometer. The thermal conductivity was calculated according to the thermal diffusion coefficient of each standard test sample obtained by test in the table, and the result is shown in the table below. The result in the table shows that the thermal conductivities of the diamond wafer from the center to the edge are essentially consistent, and they all satisfy the range of ≥1800 W/(m·K) defined by the present disclosure.

| Distances from center point (mm) | 0 | 20 | 40 |
|---|---|---|---|
| $a_r$ (mm$^2$/s) | 1217 | 1211 | 1201 |
| λ (W/(m · K)) | 2228 | 2217 | 2198 |

Example 3

A synthetic method of the ultra-high thermal-conductivity diamond specifically included the following steps.

The single crystal silicon substrate with a diameter of 125 mm was selected, wherein the primary surface of the single crystal silicon substrate had a (100) lattice orientation, and had a finished surface with a roughness Ra of 0.5 nm and a flatness change of 10 μm. The hydrogen of 1000 sccm was taken as the carrier gas; the silane of 20 sccm and the methane of 20 sccm were injected; and the temperature was controlled to be 1050° C. The chemical vapor deposition was carried on the finished surface of the single crystal silicon substrate to form the single crystal silicon carbide layer with a thickness of 50 μm (it took about 5 h).

The single crystal silicon substrate was placed into the microwave plasma reactor, and the hydrogen gas of 1000 sccm was passed into the reactor. The concentration distribution of Ha and Hβ of the plasma in the reactor was measured by using the plasma emission spectrum, and the microwave input power of the reactor was adjusted to be 45 kW and the gas pressure was adjusted to be 140 Torr, so as to form a high-density plasma with a diameter more than 125 mm in the reactor, and obtain the atomic hydrogen (Hα+Hβ) with an average concentration of $1.1\times10^{17}/m^3$, wherein the distribution difference of the atomic hydrogen concentration was 9%.

The power and gas pressure of the reactor were maintained; the flow rate of hydrogen was adjusted to be 1500 sccm; and the surface temperature of the substrate was adjusted to be 800° C. This step was carried out for 5 min followed by cleaning the substrate surface.

The flow rates of hydrogen/methane were adjusted to be 3000/180 sccm respectively; the surface temperature of the substrate was adjusted to be 750° C.; and the temperature difference from the center to the edge of the substrate was controlled within 30° C. This step was carried out for 15 min to form a diamond nucleation density of $1.6\times10^{11}/cm^2$ on the substrate surface.

The flow rate of hydrogen was maintained; the flow rate of methane was adjusted to be 120 sccm; the surface temperature of the substrate was adjusted to be 720° C.; and the temperature difference from the center to the edge of the substrate was controlled within 30° C. This step was carried out for 120 min to stabilize the oriented growth of the crystal nucleus of the diamond.

Figure 4:
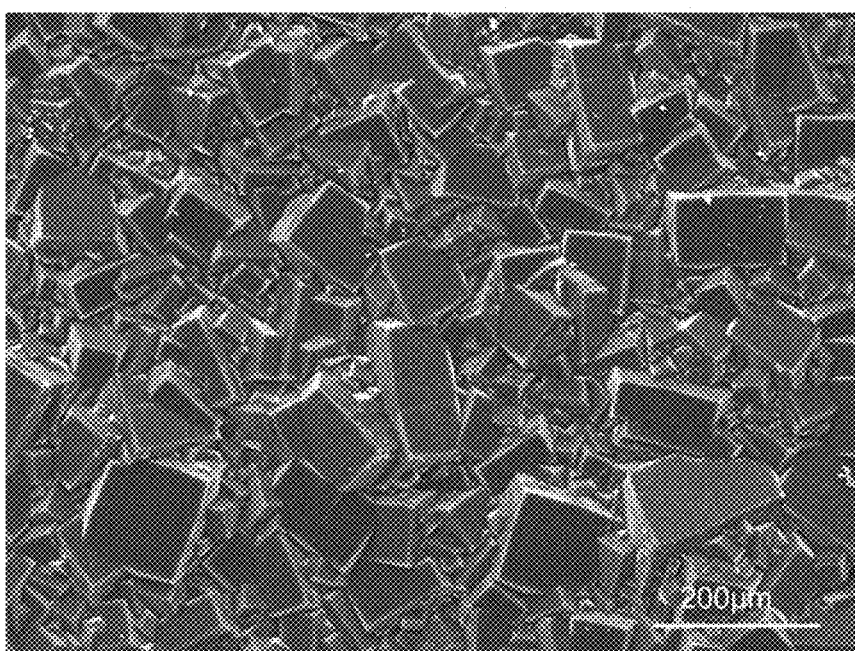
FIG. 4 shows highly oriented crystallization of a diamond formed in a <100> direction, wherein it can be seen from the figure that a diamond has a <100> crystallization characteristic.

The flow rate of hydrogen was maintained; the flow rates of methane/oxygen were adjusted to be 45/20 sccm respectively; the nitrogen at the controlled flow rate was introduced simultaneously at a concentration of 80 ppb; and the surface temperature of the substrate was adjusted to be 950° C. The synthesis process was stopped after the diamond crystal had grown to a thickness more than 650 μm, and the substrate was stripped off to obtain the diamond wafer with a diameter of 125 mm. The diamond was detected by the SEM to have a characteristic surface (shown in FIG. 4) crystalizing along the <100> direction, and the grain sizes were in the range of 50 μm-200.

The nucleation side and the growth side of the diamond were ground and polished, so as to obtain the diamond wafer with an average thickness of 500 μm and a surface roughness Ra of ≤10 nm.

One piece of standard test sample with the diameter of 20 mm was cut respectively at positions of 0 mm, 20 mm, and 40 mm away from the center point of the diamond wafer, and they were used to test the thermal diffusion coefficient at 298 k by the laser flash method using conductometer. The thermal conductivity was calculated according to the thermal diffusion coefficient of each standard test sample obtained by test in the table, and the result is shown in the table below. The result in the table shows that the thermal conductivities of the diamond wafer from the center to the edge are essentially consistent, and they all satisfy the range of ≥1800 W/(m·K) defined by the present disclosure.

| Distances from center point (mm) | 0 | 20 | 40 |
|---|---|---|---|
| $a_r$ (mm²/s) | 1124 | 1096 | 1048 |
| λ (W/(m · K)) | 2057 | 2006 | 1918 |

According to the detailed description of the embodiments, the synthetic method of the present disclosure can synthesize the ultra-high thermal-conductivity diamond with the diameter of ≥100 mm and the thermal conductivity of ≥1800

W/(m·K), and all regions of the diamond have the basically consistent thermal performance, which overcomes the technical defect of the lower thermal performance of the existing diamonds of this type, and effectively avoids the occurrence of the phenomenon that the quality of the existing diamond wafer is easy to be worse gradually from the center of the wafer to the edge, so as to satisfy the application requirement of efficient heat dissipation for the gallium nitride semiconductor components.

The foregoing is only preferred embodiments of the present disclosure. It should be noted that for a person of ordinary skill in the art, a number of improvements and embellishments may be made without departing from the principles of the present disclosure, and these improvements and embellishments should also be regarded as the scope of protection of the present disclosure.

The invention claimed is:

1. An ultra-high thermal-conductivity diamond, comprising following features:
(1) a diameter of ≥100 mm in linear dimension and a thickness of ≥300 μm;
(2) a thermal conductivity of ≥1800 W/(m·K) at 298K; and
(3) at least one surface with a surface roughness of Ra≤10 nm, wherein
the ultra high thermal-conductivity diamond is a polycrystalline diamond with highly oriented crystals along <110> or <100> direction,
the ultra-high thermal-conductivity diamond bas two characteristic primary surfaces comprising one nucleation side and one growth side, and
a nucleation density of the nucleation side is $\geq1\times10^9/cm^2$, and a grain size of the growth side is 50 μm-200 μm.

2. The ultra-high thermal-conductivity diamond according to claim 1, wherein the ultra-high thermal-conductivity diamond contains nitrogen impurity of ≤100 ppb, and the ultra-high thermal-conductivity diamond has a black spot defect size of ≤100 μm, wherein an average black spot density is $\leq1/cm^2$.

3. The ultra-high thermal-conductivity diamond according to claim 1, wherein the ultra-high thermal-conductivity diamond has a dielectric constant of ≥5.4, a dielectric loss tangent tanδ of $\leq6\times10^{-5}$, a volume resistivity of $\geq1\times10^{11}$ Ωm, and a breakdown voltage of ≥1000V@300 μm.

4. A synthetic method for an ultra-high thermal-conductivity diamond, comprising following steps:
(1) providing a substrate for a diamond growth, and then forming a structural modulation layer of the diamond or nucleation sites of the diamond on a substrate surface;
(2) providing a microwave plasma reactor for the diamond growth to uniformly form a plasma containing carbon-hydrogen radicals above the substrate;
(3) performing a chemical vapor deposition on the substrate surface for an epitaxial growth of the diamond; and
(4) stripping the diamond from the substrate, and grinding and polishing a nucleation side and a growth side of the diamond,
wherein the ultra-high thermal-conductivity diamond comprises following features:
(i) a diameter of ≥100 mm in linear dimension and a thickness of ≥300 μm;
(ii) a thermal conductivity of ≥1800 W/(m·K) at 298K; and
(iii) at least one surface with a surface roughness of Ra≤10 nm.

5. The synthetic method for the ultra-high thermal-conductivity diamond according to claim 4, wherein the substrate comprises one of a single crystal silicon substrate or refractory metal substrates forming carbide, and the substrate has at least one finished surface with a roughness of ≤10 nm and a flatness change of ≤10 μm.

6. The synthetic method for the ultra-high thermal-conductivity diamond according to claim 4, wherein forming the structural modulation layer of the diamond on the substrate surface is to form a single crystal silicon carbide on a finished surface of a (100) single crystal silicon substrate; and forming the nucleation sites of the diamond on the substrate surface is to form a point or linear surface damage with a width and depth of ≤100 nm and a maximum spacing of ≤5 μm on the finished surface of any substrate.

7. The synthetic method for the ultra-high thermal-conductivity diamond according to claim 4, wherein the microwave plasma reactor forms a plasma with an effective diameter of ≥100 mm above the substrate, wherein an average concentration of atomic hydrogen (Hα+Hβ) of the plasma in an effective diameter range is ≥1×10$^{17}$/m$^3$, and a distribution difference of an atomic hydrogen concentration is ≤10%.

8. The synthetic method for the ultra-high thermal-conductivity diamond according to claim 4, wherein the epitaxial growth of the diamond in step (3) comprises one or more of following steps:

(1) cleaning the substrate surface in a hydrogen plasma at a temperature of 700-900° C.;

(2) carrying out a nucleation of the diamond in a carbon-hydrogen plasma containing 2-6% carbon at a temperature of 750-850° C.;

(3) stabilizing an oriented growth of a crystal nucleus of the diamond in a carbon-hydrogen plasma containing 1-4% carbon at a temperature of 680-780° C.; and (4) carrying out the epitaxial growth of the diamond in a carbon-hydrogen plasma containing 0.5-3% carbon at a temperature of 850-1050° C.

9. The synthetic method for the ultra-high thermal-conductivity diamond according to claim 4, wherein the ultra-high thermal-conductivity diamond is polycrystalline diamond with highly oriented crystals along <110> or <100> direction.

10. The synthetic method for the ultra-high thermal-conductivity diamond according to claim 9, wherein the ultra-high thermal-conductivity diamond has two characteristic primary surfaces comprising one nucleation side and one growth side, wherein a nucleation density of the nucleation side is ≥1×10$^9$/cm$^2$, and a grain size of the growth side is 50 μm-200 μm.

11. The synthetic method for the ultra-high thermal-conductivity diamond according to claim 4, wherein the ultra-high thermal-conductivity diamond contains nitrogen impurity of ≤100 ppb, and the ultra-high thermal-conductivity diamond has a black spot defect size of ≤100 μm, wherein an average black spot density is ≤1/cm$^2$.

12. The synthetic method for the ultra-high thermal-conductivity diamond according to claim 4, wherein the ultra-high thermal-conductivity diamond has a dielectric constant of ≥5.4, a dielectric loss tangent tanδ of ≤6×10$^{-5}$, a volume resistivity of ≥1×10$^{11}$ Ωm, and a breakdown voltage of ≥1000V@300 μm.

\* \* \* \* \*